US009454255B2

(12) United States Patent
El Kallassi et al.

(10) Patent No.: US 9,454,255 B2
(45) Date of Patent: *Sep. 27, 2016

(54) DEVICE AND METHOD FOR LOCALIZED FORCE SENSING

(71) Applicant: Synaptics Incorporated, San Jose, CA (US)

(72) Inventors: Pascale El Kallassi, Menlo Park, CA (US); Bob Lee MacKey, San Jose, CA (US)

(73) Assignee: Synapitcs Incorporated, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/731,376

(22) Filed: Jun. 4, 2015

(65) Prior Publication Data

US 2015/0268784 A1 Sep. 24, 2015

Related U.S. Application Data

(63) Continuation of application No. 13/838,003, filed on Mar. 15, 2013, now Pat. No. 9,075,095.

(60) Provisional application No. 61/770,074, filed on Feb. 27, 2013.

(51) Int. Cl.
*G06F 3/041* (2006.01)
*G01R 27/26* (2006.01)
(Continued)

(52) U.S. Cl.
CPC ............. *G06F 3/0414* (2013.01); *G01L 1/146* (2013.01); *G01R 27/2605* (2013.01);
(Continued)

(58) Field of Classification Search
CPC ......... G01L 1/00; G01L 1/142; G06F 3/049; G06F 3/042; G01R 27/26
USPC ..................................................... 73/862.626
See application file for complete search history.

(56) References Cited

U.S. PATENT DOCUMENTS

| 5,510,813 A | 4/1996 | Makinwa et al. |
| 5,942,733 A | 8/1999 | Allen et al. |

(Continued)

OTHER PUBLICATIONS

International Search Report for corresponding International Application No. PCT/US2014/017900, mailed Jun. 8, 2014 (5 pages).

(Continued)

*Primary Examiner* — Lisa Caputo
*Assistant Examiner* — Octavia Hollington
(74) *Attorney, Agent, or Firm* — Osha Liang LLP

(57) ABSTRACT

A device and method for operating a capacitive touch screen input device configured to sense input objects and their applied force in a sensing region, the device including a pliable component having an input surface and characterized by a bending stiffness, and first and second arrays of sensor electrodes. The input device further includes a third array of sensor electrodes and a spacing layer disposed between the third array. The pliable component is characterized by a compressive stiffness and configured to deform in response to a force applied to the input surface and to deflect the second array of sensor electrodes towards the third array of sensor electrodes, wherein the deformation of the input surface and the deflection of the second array of sensor electrodes is a function of the ratio of the bending stiffness of the pliable component and the compressive stiffness of the spacing layer.

21 Claims, 11 Drawing Sheets

(51) Int. Cl.
*G01L 1/14* (2006.01)
*G06F 3/044* (2006.01)

(52) U.S. Cl.
CPC .... *G06F 3/044* (2013.01); *G06F 2203/04103* (2013.01); *G06F 2203/04106* (2013.01); *G06F 2203/04111* (2013.01); *G06F 2203/04112* (2013.01)

(56) References Cited

U.S. PATENT DOCUMENTS

| | | |
|---|---|---|
| 5,943,044 A | 8/1999 | Martinelli et al. |
| 6,002,389 A | 12/1999 | Kasser |
| 7,154,481 B2 | 12/2006 | Cross et al. |
| 7,215,329 B2 | 5/2007 | Yoshikawa et al. |
| 7,395,717 B2 | 7/2008 | DeAngelis et al. |
| 7,538,760 B2 | 5/2009 | Hotelling et al. |
| 8,627,716 B2 | 1/2014 | Son |
| 9,041,418 B2 * | 5/2015 | Hsieh ............... G06F 3/044 178/18.01 |
| 2004/0090429 A1 | 5/2004 | Geaghan et al. |
| 2006/0260417 A1 | 11/2006 | Son et al. |
| 2007/0229464 A1 | 10/2007 | Hotelling et al. |
| 2007/0236466 A1 | 10/2007 | Hotelling |
| 2008/0174321 A1 | 7/2008 | Kang et al. |
| 2010/0242629 A1 | 9/2010 | Leuenberger et al. |
| 2010/0253651 A1 | 10/2010 | Day |
| 2010/0282000 A1 | 11/2010 | Gorjanc et al. |
| 2011/0096025 A1 | 4/2011 | Slobodin et al. |
| 2011/0227872 A1 | 9/2011 | Huska et al. |
| 2011/0278078 A1 | 11/2011 | Schediwy et al. |
| 2012/0026124 A1 | 2/2012 | Li et al. |
| 2012/0038583 A1 | 2/2012 | Westhues et al. |
| 2012/0062245 A1 | 3/2012 | Bao et al. |
| 2012/0105367 A1 | 5/2012 | Son et al. |
| 2012/0256876 A1 | 10/2012 | Yeh et al. |

OTHER PUBLICATIONS

International Preliminary Report on Patentability issued in the corresponding International Application No. PCT/US2014/017900, mailed Sep. 11, 2015 (10 pages).

* cited by examiner

DEVICE AND METHOD FOR LOCALIZED FORCE SENSING

PRIORITY DATA

This application claims priority of U.S. patent application Ser. No. 13/838,003, which was filed on Mar. 15, 2013, and U.S. Provisional Patent Application Ser. No. 61/770,074, filed Feb. 27, 2013, which are incorporated herein by reference.

FIELD OF THE INVENTION

This invention generally relates to electronic devices, and more specifically relates to sensor devices and using sensor devices for producing user interface inputs.

BACKGROUND OF THE INVENTION

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

The proximity sensor device can be used to enable control of an associated electronic system. For example, proximity sensor devices are often used as input devices for larger computing systems, including: notebook computers and desktop computers. Proximity sensor devices are also often used in smaller systems, including: handheld systems such as personal digital assistants (PDAs), remote controls, and communication systems such as wireless telephones and text messaging systems. Increasingly, proximity sensor devices are used in media systems, such as CD, DVD, MP3, video or other media recorders or players. The proximity sensor device can be integral or peripheral to the computing system with which it interacts.

Some input devices also have the ability to detect applied force in addition to determining positional information for input objects interacting with a sensing region of the input device. However, presently known force/touch input devices are limited in their ability to accurately determine the position and/or intensity at which force is applied. This limits the flexibility and usability of presently known force enabled input devices. An improved force enhanced input device is thus needed in which the position and/or intensity of the applied force may be precisely determined.

BRIEF SUMMARY OF THE INVENTION

Embodiments of the present invention provide a device and method that facilitates improved device usability. The device and method provide improved user interface functionality through the use of a pliable component having a bending stiffness, overlaid upon a compressible layer having a compression stiffness to thereby facilitate localized bending zones uniformly distributed across a sensing surface of a capacitive input device. The ratio of the bending stiffness to the compression stiffness is configured such, in response to force applied to the input surface by an input object, the resulting compressed region is spread out over a plurality of force receiver electrode coordinate locations. Consequently, the force data associated with the coordinate locations may be interpolated to accurately determine the coordinate position and/or magnitude of the applied force.

BRIEF DESCRIPTION OF DRAWINGS

The preferred exemplary embodiment of the present invention will hereinafter be described in conjunction with the appended drawings, where like designations denote like elements, and.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
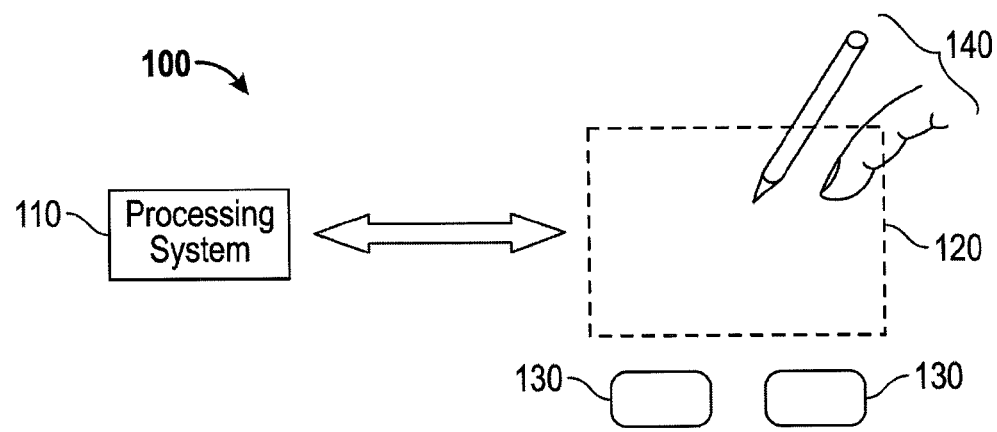
FIG. 1 is a block diagram of an exemplary electronic system that includes an input device and a processing system in accordance with an embodiment of the invention.

Turning now to the figures, FIG. 1 is a block diagram of an exemplary input device 100 in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In a preferred embodiment, the input device 100 is implemented as a force enabled touchpad system including a processing system 110 and a sensing region 120. Sensing region 120 (also often referred to as "touchpad") is configured to sense input provided by one or more input objects 140 in the sensing region 120. Example input objects include fingers, thumb, palm, and styli. The sensing region 120 is illustrated schematically as a rectangle; however, it should be understood that the sensing region may be of any convenient form and in any desired arrangement on the surface of and/or otherwise integrated with the touchpad.

Sensing region 120 may encompass any space above (e.g., hovering), around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device is adapted to provide user interface functionality by facilitating data entry responsive to the position of sensed objects and the force applied by such objects. Specifically, the processing system is configured to determine positional information for objects sensed by a sensor in the sensing region. This positional information can then be used by the system to provide a wide range of user interface functionality Furthermore, the processing system is configured to determine force information for objects from measures of force determined by the sensor(s). This force information can then also be used by the system to provide a wide range of user interface functionality, for example, by providing different user interface functions in response to different levels of applied force by objects in the sensing region. Furthermore, the processing system may be configured to determine input information for more than one object sensed in the sensing region. Input information can be based upon a combination the force information, the positional information, the number of input objects in the sensing region and/or in contact with the input surface, and a duration the one or more input objects is touching or in proximity to the input surface. Input information can then be used by the system to provide a wide range of user interface functionality.

The input device is sensitive to input by one or more input objects (e.g. fingers, styli, etc.), such as the position of an input object within the sensing region. The sensing region encompasses any space above, around, in and/or near the input device in which the input device is able to detect user input (e.g., user input provided by one or more input objects). The sizes, shapes, and locations of particular sensing regions may vary widely from embodiment to embodiment. In some embodiments, the sensing region extends from a surface of the input device in one or more directions into space until signal-to-noise ratios prevent sufficiently accurate object detection. The distance to which this sensing region extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device, contact with an input surface (e.g. a touch surface) of the input device, contact with an input surface of the input device coupled with some amount of applied force, and/or a combination thereof. In various embodiments, input surfaces may be provided by surfaces of casings within which the sensor electrodes reside, by face sheets applied over the sensor electrodes or any casings.

The electronic system 100 may utilize any combination of sensor components and sensing technologies to detect user input (e.g., force, proximity) in the sensing region 120 or otherwise associated with the touchpad. The input device 102 comprises one or more sensing elements for detecting user input. As several non-limiting examples, the input device 100 may use capacitive, elastive, resistive, inductive, magnetic, acoustic, ultrasonic, and/or optical techniques.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be unifamily resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

It should also be understood that the input device may be implemented with a variety of different methods to determine force imparted onto the input surface of the input device. For example, the input device may include mechanisms disposed proximate the input surface and configured to provide an electrical signal representative of an absolute or a change in force applied onto the input surface. In some embodiments, the input device may be configured to determine force information based on a defection of the input surface relative to a conductor (e.g. a display screen underlying the input surface). In some embodiments, the input surface may be configured to deflect about one or multiple axis. In some embodiments, the input surface may be configured to deflect in a substantially uniform or non-uniform manner. In various embodiments, the force sensors may be based on changes in capacitance and/or changes in resistance.

In FIG. 1, a processing system 110 is shown as part of the input device 100. However, in other embodiments the processing system may be located in the host electronic device with which the touchpad operates. The processing system 110 is configured to operate the hardware of the input device 100 to detect various inputs from the sensing region 120. The processing system 110 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as graphical user interface (GUI) actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions. The types of actions may include, but are not limited to, pointing, tapping, selecting, clicking, double clicking, panning, zooming, and scrolling. Other examples of possible actions include an initiation and/or rate or speed of an action, such as a click, scroll, zoom, or pan.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information, particularly regarding the presence of an input object in the sensing region. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

Likewise, the term "force information" as used herein is intended to broadly encompass force information regardless of format. For example, the force information can be provided for each input object as a vector or scalar quantity. As another example, the force information can be provided as an indication that determined force has or has not crossed a threshold amount. As other examples, the force information can also include time history components used for gesture recognition. As will be described in greater detail below, positional information and force information from the processing systems may be used to facilitate a full range of interface inputs, including use of the proximity sensor device as a pointing device for selection, cursor control, scrolling, and other functions.

Likewise, the term "input information" as used herein is intended to broadly encompass temporal, positional and force information regardless of format, for any number of input objects. In some embodiments, input information may be determined for individual input objects. In other embodiments, input information comprises the number of input objects interacting with the input device.

In some embodiments, the input device 100 is implemented with additional input components that are operated by the processing system 110 or by some other processing system. These additional input components may provide redundant functionality for input in the sensing region 120, or some other functionality. For example, buttons (not shown) may be placed near the sensing region 120 and used to facilitate selection of items using the input device 102. Other types of additional input components include sliders, balls, wheels, switches, and the like. Conversely, in some embodiments, the input device 100 may be implemented with no other input components.

In some embodiments, the electronic system 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

It should also be understood that the input device may be implemented with a variety of different methods to determine force imparted onto the input surface of the input device. For example, the input device may include mechanisms disposed proximate the input surface and configured to provide an electrical signal representative of an absolute or a change in force applied onto the input surface. In some embodiments, the input device may be configured to determine force information based on a defection of the input surface relative to a conductor (e.g. a display screen underlying the input surface). In some embodiments, the input surface may be configured to deflect about one or multiple axis. In some embodiments, the input surface may be configured to deflect in a substantially uniform or non-uniform manner.

As described above, in some embodiments some part of the electronic system processes information received from the processing system to determine input information and to act on user input, such as to facilitate a full range of actions. It should be appreciated that some uniquely input information may result in the same or different action. For example, in some embodiments, input information for an input object comprising, a force value F, a location X,Y and a time of contact T may result in a first action. While input information for an input object comprising a force value F', a location X',Y' and a time of contact T' (where the prime values are uniquely different from the non-prime values) may also result in the first action. Furthermore, input information for an input object comprising a force value F, a location X',Y and a time of contact T' may result in a first action. While the examples below describe actions which may be performed based on input information comprising a specific range of values for force, position and the like, it should be appreciated that that different input information (as described above) may result in the same action. Furthermore, the same type of user input may provide different functionality based on a component of the input information. For example, different values of F, X/Y and T may result in the same type of action (e.g. panning, zooming, etc.), that type of action may behave differently based upon said values or other values (e.g. zooming faster, panning slower, and the like).

As noted above, the embodiments of the invention can be implemented with a variety of different types and arrangements of capacitive sensor electrodes for detecting force and/or positional information. To name several examples, the input device can be implemented with electrode arrays that are formed on multiple substrate layers, typically with the electrodes for sensing in one direction (e.g., the "X" direction) formed on a first layer, while the electrodes for sensing in a second direction (e.g., the "Y" direction are formed on a second layer. In other embodiments, the sensor electrodes for both the X and Y sensing can be formed on the same layer. In yet other embodiments, the sensor electrodes can be arranged for sensing in only one direction, e.g., in either the X or the Y direction. In still another embodiment, the sensor electrodes can be arranged to provide positional information in polar coordinates, such as "r" and "θ" as one example. In these embodiments the sensor electrodes themselves are commonly arranged in a circle or other looped shape to provide "θ", with the shapes of individual sensor electrodes used to provide "r".

Also, a variety of different sensor electrode shapes can be used, including electrodes shaped as thin lines, rectangles, diamonds, wedge, etc. Finally, a variety of conductive materials and fabrication techniques can be used to form the sensor electrodes. As one example, the sensor electrodes are formed by the deposition and etching of conductive ink on a substrate.

In some embodiments, the input device is comprises a sensor device configured to detect contact area and location of a user interacting with the device. The input sensor device may be further configured to detect positional information about the user, such as the position and movement of the hand and any fingers relative to an input surface (or sensing region) of the sensor device.

In some embodiments, the input device is used as an indirect interaction device. An indirect interaction device may control GUI actions on a display which is separate from the input device, for example a touchpad of a laptop computer. In one embodiment, the input device may operate as a direct interaction device. A direct interaction device controls GUI actions on a display which underlies a proximity sensor, for example a touch screen. There are various usability differences between indirect and direct more which may confuse or prevent full operation of the input device. For example, an indirect input device may be used to position a cursor over a button by moving an input object over a proximity sensor. This is done indirectly, as the motion of the input does not overlap the response on the display. In a similar case, a direct interaction device may be used to position a cursor over a button by placing an input object directly over or onto the desired button on a touch screen.

Figure 2:
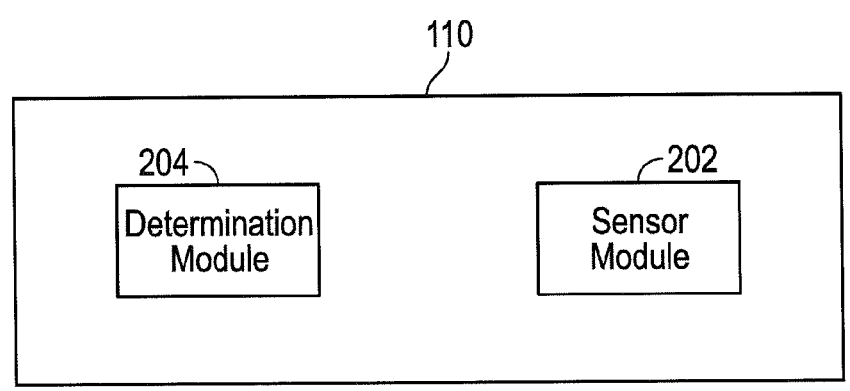
FIG. 2 is a schematic view of an exemplary processing system in accordance with an embodiment of the invention.

Referring now to FIGS. 1 and 2, the processing system 110 includes a sensor module 202 and a determination module 204. Sensor module 202 is configured to operate the sensors associated with the input device 100 and sensing region 120. For example, the sensor module 202 may be configured to transmit sensor signals and receive resulting signals from the sensors associated with sensing region 120. Determination module 204 is configured to process data (e.g. the resulting signals) and to determine positional information and force information for input objects interacting with the sensing region 120. The embodiments of the invention can be used to enable a variety of different capabilities on the host device. Specifically, it can be used to enable cursor positioning, scrolling, dragging, icon selection, closing windows on a desktop, putting a computer into sleep mode, or perform any other type of mode switch or interface action.

Figure 3A:
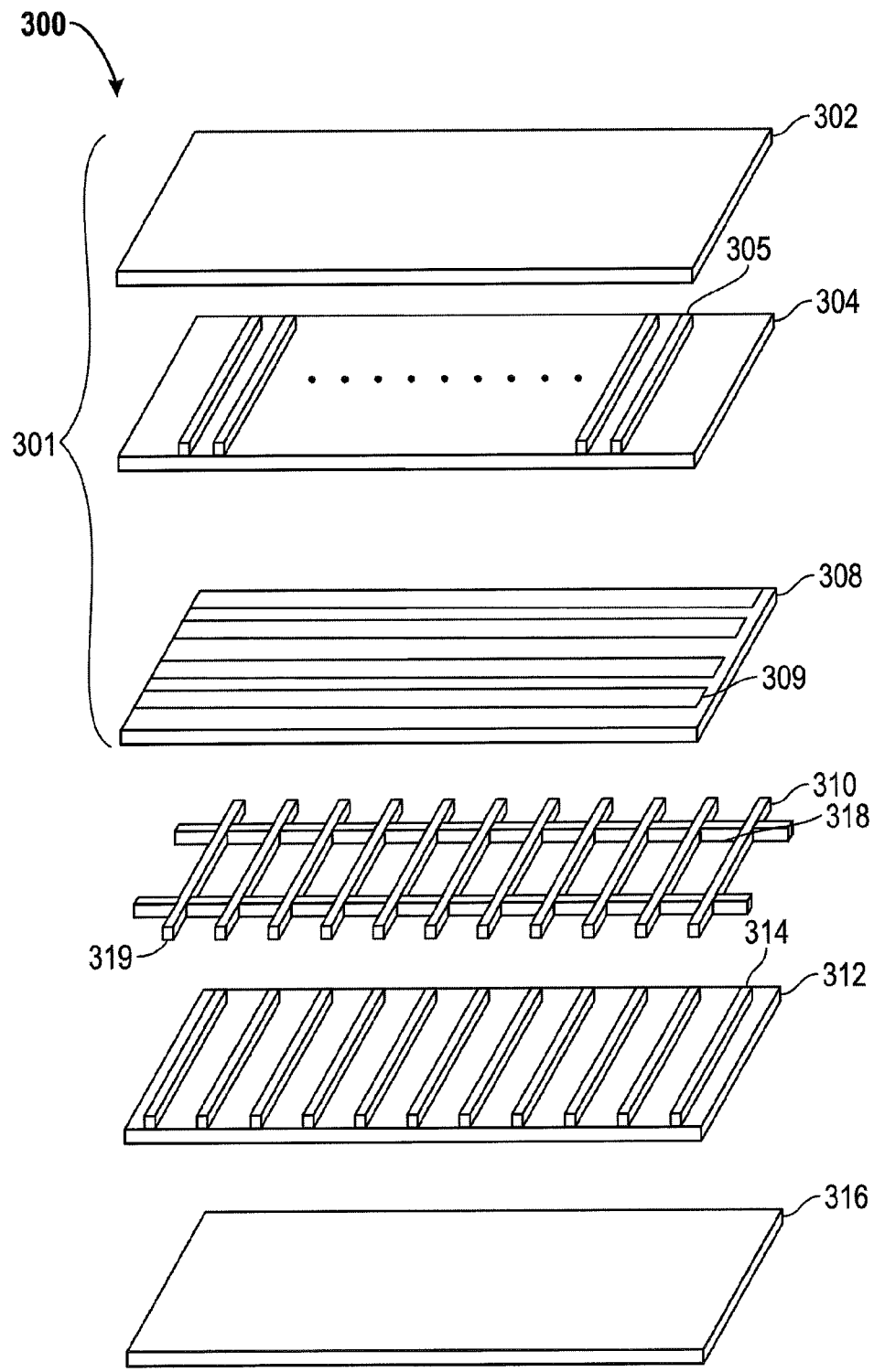
FIG. 3A is a schematic perspective view of a pressure imaging sensor stack-up in accordance with an embodiment of the invention.

Referring now to FIG. 3A, input device 300 includes a pliable component 301, a compressible layer 310, a sensor electrode layer 312, and a support layer 316. More particularly, pliable component 301 includes an input surface 302 comprising plastic, glass, or other suitable material, a first sensor electrode layer 304, and a second sensor electrode layer 308. In one embodiment, first sensor electrode layer 304 includes a first array of sensor electrodes 305, second sensor electrode layer 308 includes a second array of sensor electrodes 309, and sensor electrode layer 312 includes a third array of sensor electrodes 314. In some embodiments, the first and second sensor electrode arrays 305 and 309 are configured to sense positional information for input objects in the sensing region of the input device 300. The first and second arrays 305 and 309 may be configured to perform "absolute capacitance" and/or "trans-capacitive" sensing to determine input objects in the sensing region. The second and third arrays 309 and 314 are configured to sense force information for input objects contacting the input surface 302. The second and third arrays 309, 314 may be configured to perform "absolute capacitance" and/or "trans-capacitive" sensing to detect localized compression of the compressible layer 310 resulting from a force applied to surface 302.

Still referring to FIG. 3A, the pliable component 301 may be modeled as a composite structure, for example, a laminated structure, such that the entire assembly is characterized by a substantially uniform bending stiffness.

The compressible layer 310 comprises, in the illustrated embodiment, an array of rows 318 and columns 319 forming a grid. In other embodiments, compressible layer 310 may be implemented as a series of spacer dots, a closed cell or open cell foam structure, a matrix of triangular or other geometric structure, or any other chemical composition and/or mechanical construction which exhibits a substantially uniform compression stiffness across the two dimensional surface and/or three dimensional volume of compressible layer 310. As such, compressible layer may be characterized by a substantially uniform compression stiffness to a first order of approximation.

Support layer 316 may be partially, substantially, or completely rigid, but in any event should be sufficiently rigid to function as a back plane to resist force applied downwardly upon the top surface of the pliable component 301. The support layer may be a part of the electronic system in which the input device 300 is housed. For example, the support layer 316 may be a housing of a portable electronic device (e.g. a laptop, cell phone, tablet, etc.).

It should be appreciated that in some embodiments one or more layers may be added to or removed from the stack-up 300 shown in FIG. 3A without impairing its function. For example, in the illustrated embodiment of FIG. 3B the first array of sensor electrodes 305 and second array of sensor electrodes 309 may be disposed in a single layer 344. In the illustrated embodiment, pliable component 301 comprises input surface 302 and the single layer 344 including first and second sensor electrode arrays 305 and 309. In another embodiment, the first and second arrays of sensor electrodes may be disposed on the input surface 302 (e.g., on a side opposite of expected user input and contact); in this example, the pliable component would comprise the input surface 302 and first and second arrays of sensor electrodes 305 and 309.

Figure 3B:
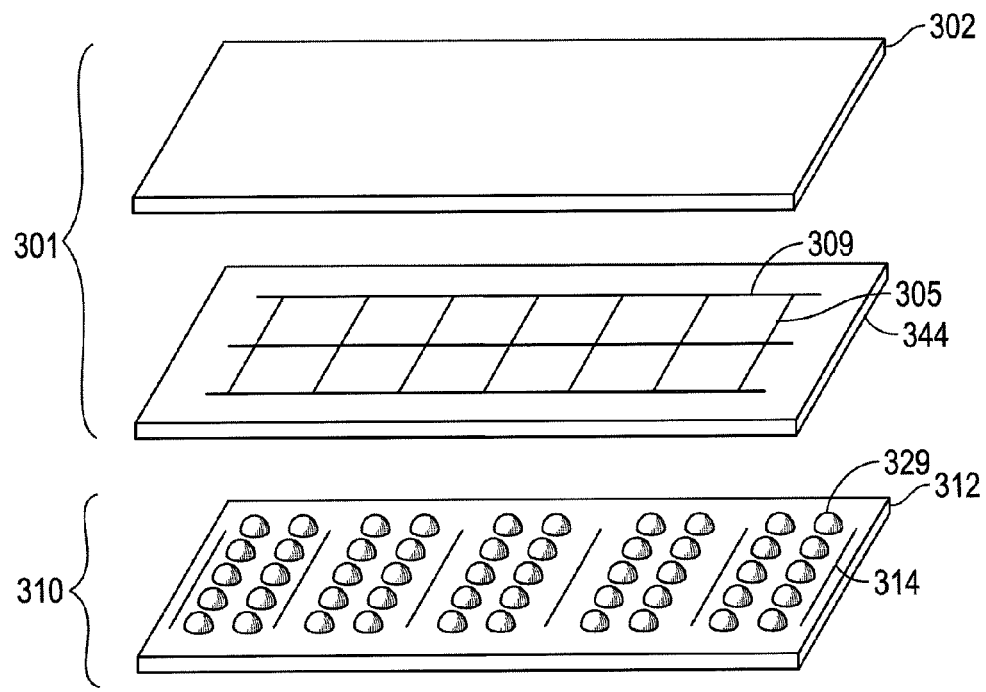
FIG. 3B is schematic perspective view of an alternate embodiment of the pressure imaging sensor stack-up of FIG. 3A in accordance with an embodiment of the invention.

Still referring to FIG. 3B, the input device may also include a third array of sensor electrodes 314 disposed on substrate 312. The input device further includes compressible layer (analogous to compressible layer 310) in the form of an array of compressible structures 329 disposed on substrate 312. In some embodiments, each individual electrode of the third array 314 is disposed "between" one or more individual compressible structures 329. In other embodiments, each individual electrode of the third array 314 may be configured to overlap at least one compressible structure 329. In the embodiment illustrated in FIG. 3B, the third array of sensor electrodes 314 is arranged in a direction substantially parallel to the first array of sensor electrodes 305. In some embodiments, the third array of sensor electrodes 314 is arranged in a direction substantially parallel to the direction of one of the first and second arrays of sensor electrodes 305 and 309. Furthermore, in the embodiment of FIG. 3B, the third array of sensor electrodes 314 substantially overlaps the first array of sensor electrodes 305 (when viewed from the top of input device 300). The substrate 312 may also be configured to function as a back plane to resist force applied downwardly upon the top surface of the pliable component 301 (similar to the function of support layer 316 of FIG. 3A).

Figure 3C:
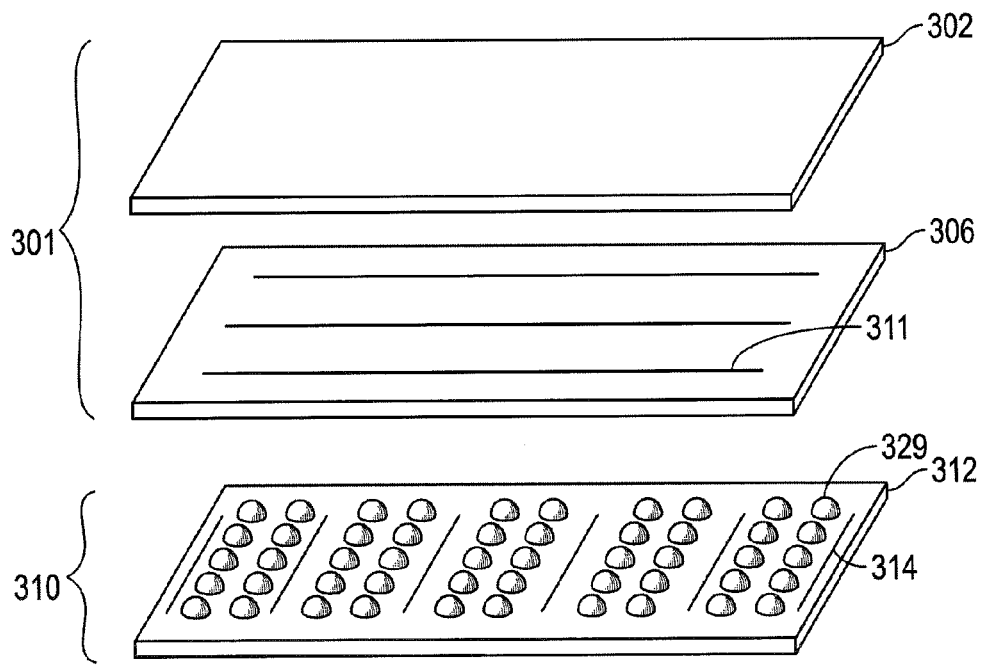
FIG. 3C is a schematic perspective view of a further embodiment of a pressure imaging sensor stack-up in accordance with an embodiment of the invention.

Referring now to FIG. 3C, another embodiment of the pliable component 301 of input device 300 may include a flexible display 306. In some embodiments where the input device 300 includes a display, the same sensor electrode array used for sensing positional information may also be used for updating the display. In some embodiments, an array of sensor electrodes 311 may be disposed on the non-viewing side of the display 306. The sensor electrode array 311 is configured to sense force information for input objects contacting the input surface 302. Specifically, at least one electrode of the array 309 is configured to deflect, in response to force imparted on the input surface 302, toward the sensor electrode array 314 disposed on substrate 312.

Figure 3D:
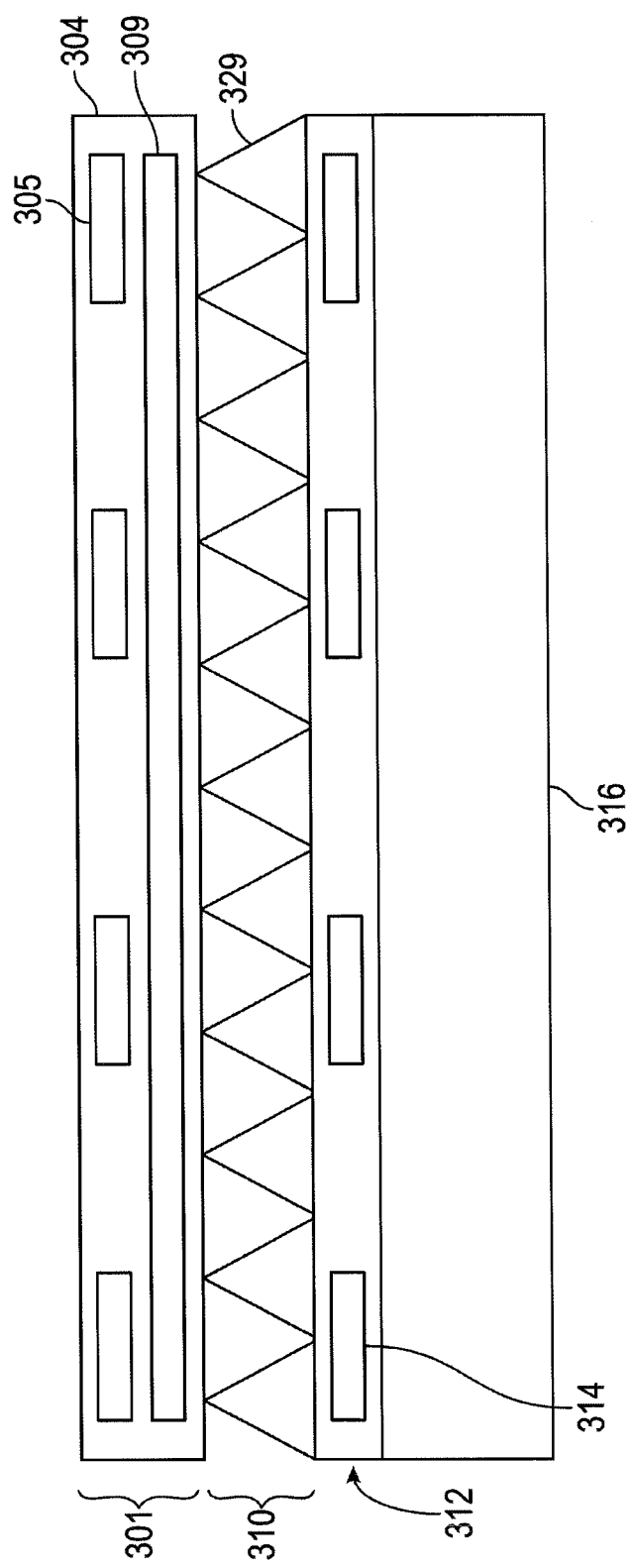
FIG. 3D is a cross section view of an alternate embodiment of an input device stack-up including a compressible layer.

Referring now to FIG. 3D, another embodiment of the compressible layer 310 is shown. The compressible layer 310 is illustrated as a matrix of compressible structures 329 formed between the pliable component 301 and the third array of sensor electrodes 312. While the illustration is not to scale, FIG. 3D is nonetheless intended to show a finer pitch of compressible structures 329 than shown in FIGS. 3A-C. Furthermore, the compressible 329 structures are disposed onto the sensor substrate 312 which comprises the third array of sensor electrodes 314. As can also be seen in FIG. 3D, the sensor electrodes 314 are not spaced between the compressible structures 329 (as was shown in FIGS. 3B-C).

Figure 4:
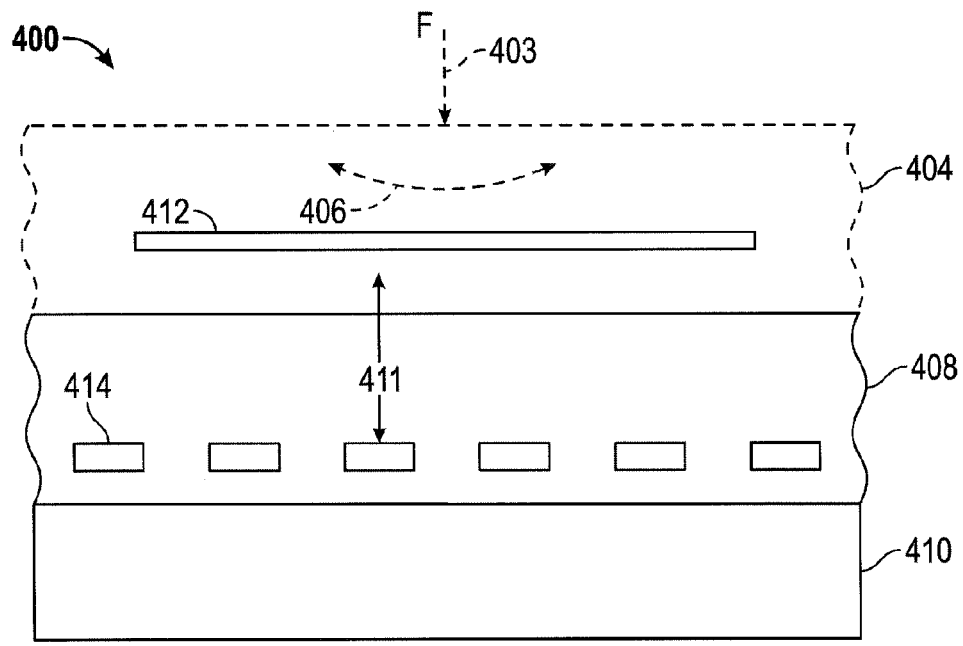
FIG. 4 is a schematic cross section view of a portion of the stack-up of FIG. 3 in accordance with an embodiment of the invention.

FIG. 4 is a schematic cross section view of a portion of stack-up 300 of FIG. 3. More particularly, FIG. 4 shows a stack 400 including a pliable component 404, a compressible layer 408, and a support layer 410. Pliable component 404 is generally analogous to pliable component 301 of FIGS. 3A-C, and is characterized by a substantially uniform bending stiffness. Compressible layer 408 is generally analogous to compressible layer 310 of FIGS. 3A-C. As such, a force 402 applied by an input object creates a localized deflection region (represented by arrow 406) as a function of the bending stiffness of pliable component 404 and the compression stiffness and physical arrangement of compressible layer 408. In one embodiment, the function is proportional to the ratio of the bending stiffness of pliable component 404 to the compression stiffness of compression layer 408.

Stack 400 further includes a first array of sensor electrodes (not shown), a second array of sensor electrodes 412, and a third array of sensor electrodes 414. In one embodiment, the second array of sensor electrodes 412 are driven with a sensing signal and a resulting signal is received on the third array of sensor electrodes 414 to determine force imparted to the input surface, based on the variable capacitance between corresponding sensing electrodes in the two arrays. In one embodiment, the second array of sensor electrodes 412 are transmitter electrodes driven by the processing system, and the third array of sensor electrodes 414 are force receiver electrodes upon which signals are received by the processing system relating to applied force. In another embodiment, the third array 414 may be driven as transmitter electrodes and second array 412 may function as force receiver electrodes.

With continued reference to FIG. 4, applied force 402 causes pliable component 404 to deform and deflect locally, decreasing the distance 411 between the second array of sensing electrodes 412 and the third array of sensing electrodes 414 in the localized region of deformation 406. Specifically, applied force 402 causes pliable component 404 to bend, and causes compressible layer 408 to compress, in the vicinity of local bending zone 406 as a function of the ratio of the bending stiffness of pliable component 404 to the compression stiffness of compressible layer 408 and the physical arrangement of any compressible structures which may also be present in compressible layer 408. By properly configuring the various mechanical properties and dimensions of the foregoing components using known modeling and simulation techniques, an applied "point" force may deflect the pliable component 408 in an area covering a single or multiple sensor electrodes of the third sensor electrode array 414. In an embodiment, applied force 402 may result in localized bending over approximately three force receiver electrodes 414 as illustrated in the cross section views of FIGS. 4 and 5. In other embodiments, the applied force may be spread out over any number of desired force receiver electrodes, which allows the processing system to interpolate the force information to accurately determine the coordinate position of the applied force. This is particularly useful not only when the input object is a non-conductive stylus, pen, or the like, but to also enables accurate detection of multiple forces applied to the input surface.

Figure 5:
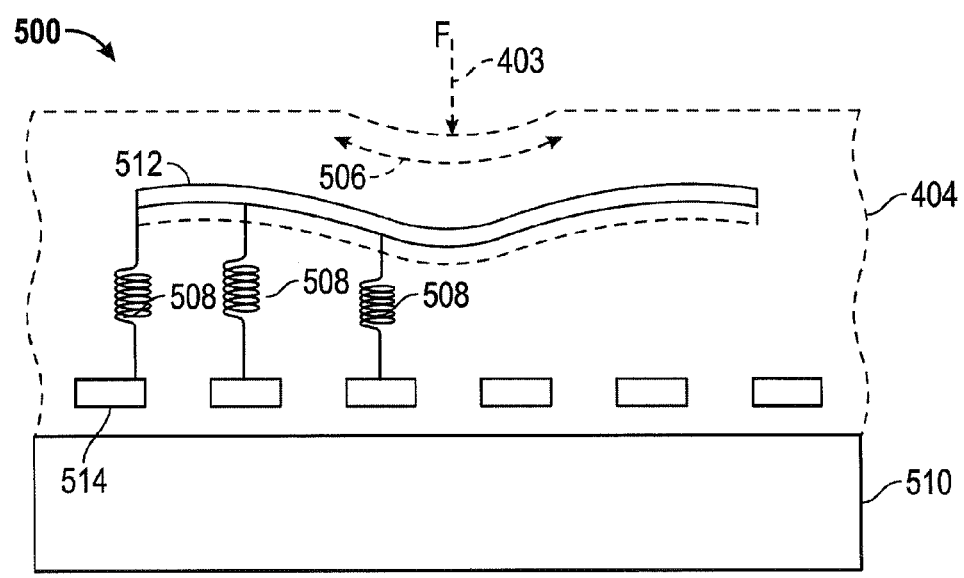
FIG. 5 is a schematic cross section view of a portion of the stack-up of FIG. 3 illustrating a deformed pliable component and a compressible layer modeled as a linear spring in accordance with an embodiment of the invention.

With continued reference to FIG. 4 and also referring now to FIG. 5, FIG. 5 is a schematic perspective view of a stack 500 comprising a pliable component 504 including a second array of sensing electrodes 512, a fixed support layer including a third array of sensing electrodes 514, and a compressible layer disposed there between and modeled as a continuum of springs 508. In one embodiment, the compressible layer comprises, to a first degree of approximation, a uniformly compressible volume, such that each localized region conforms to Hooke's law: $F=-k \cdot X$; where F is the applied force or load, k is a spring constant determined by the material and mechanical properties of the compressible layer, and X is the deflection distance resulting from the applied force. In this regard, the terms "deformation" and "bending" refer to the change in shape of the pliable component (404, 504) responsive to applied force, whereas the terms "deflection" and "translation" refer to change in position (for example, along distance 411) of electrodes 412 responsive to applied force.

Figure 6A:
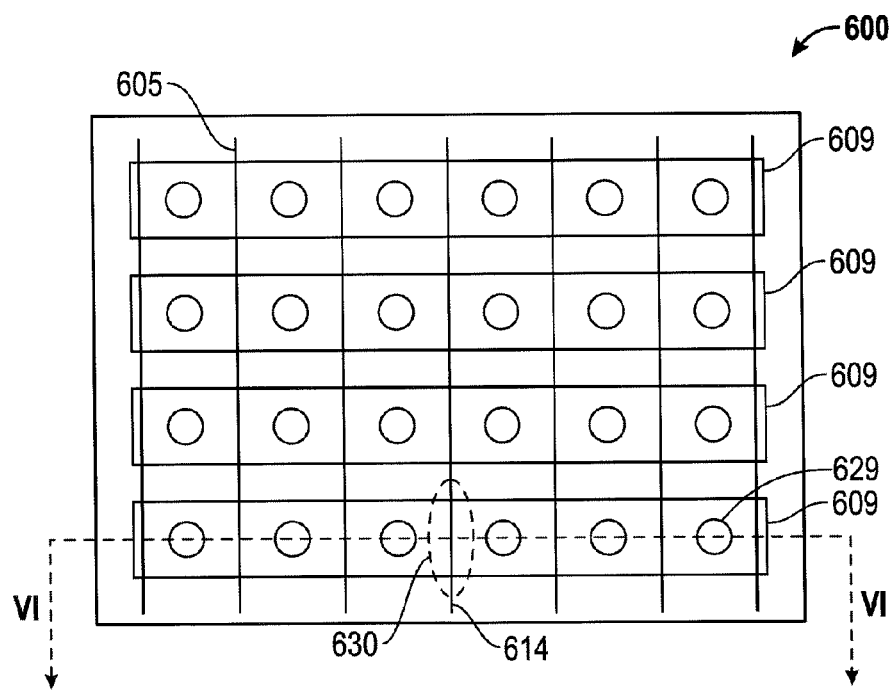
FIG. 6A is a top plan view of an input device in accordance with an embodiment of the invention.
Figure 6B:
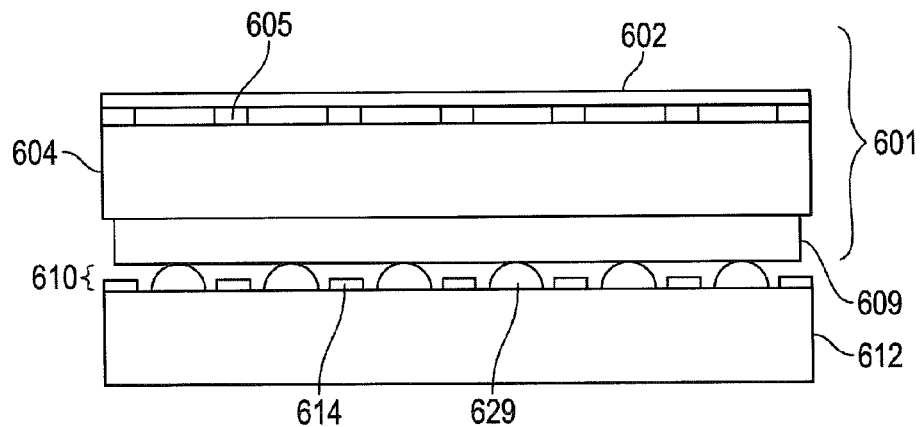
FIG. 6B is a cross section view along the line VI-VI of the input device of FIG. 6A in accordance with an embodiment of the invention.

FIGS. 6A and 6B are top view and cross section views, respectively, of an input device 600 in accordance with various embodiments of the present invention. Device 600 includes a pliable component 601, a compressible layer 610 and a support layer 612. The pliable component comprises an input surface 602, a first layer 605 having a plurality of sensor electrodes, and a second layer 609 having a plurality of sensor electrodes. The first and second sensor electrode layers 605 and 609 are configured to sense input objects in a sensing region of the input device. For example, in one embodiment, the second plurality of sensor electrodes 609 are configured to transmit a sensing signal and the first plurality of sensor electrodes 605 are configured to receive a resulting signal. While the first and second sensor electrode arrays 605 and 609 are shown as being disposed on opposite sides of sensor substrate 604, in various other embodiments, the first and second sensor electrode arrays 605 and 609 may be disposed in a single layer or multiple layers on either side of the sensor substrate 604 or input surface 602.

A third array of sensor electrodes 614 is disposed on the support layer 612, the third array of sensor electrodes substantially overlapping the first array of sensor electrodes 605. The second and third pluralities of sensor electrodes 609 and 614 are configured to sense a deflection of the pliable component 601 (and sensor electrodes 609) towards the support layer 612 (and sensor electrodes 614) in response to a force applied to the input surface 602 of the input device 600.

The second plurality 609 and third plurality 614 of sensor electrodes are capacitively coupled to each other, forming a plurality of respective variable capacitances in the area of intersections/overlap between the two arrays. One exemplary variable capacitance is shown in FIG. 6A and referred to as a force pixel (or "fixer") 630. As used herein, the term "force pixel" refers to an area of overlap between a sensor electrode of the second sensor electrode array 609 and a corresponding sensor electrode of the third sensor electrode array 614. The term "force pixel" may also refer to an area of localized capacitance between individual sensor electrodes of the second array of sensor electrodes 609 and the third array of sensor electrodes 614. As discussed above with reference to FIGS. 5-6, a force applied to the input surface 602 causes pliable component 601 to deform and deflect locally, decreasing the distance between one or more electrodes of the second array of sensing electrodes 609 and one or more electrodes of the third array of sensing electrodes 614 in the localized region of deformation.

By properly configuring the various mechanical properties and dimensions of the pliable component 601 and the compressible layer 610 using known modeling and simulation techniques, an applied force which deflects the pliable component 601 results in a change in at least one variable capacitance (force pixel) of the array of variable capacitances formed between the second and third arrays of sensor electrodes. A measurement of the change in the variable capacitance(s) can be used to determine the magnitude of force applied to the input surface in the localized area corresponding to the deflection. In various embodiments, the applied force may be determined based on a plurality of variable capacitances, which allows the processing system to interpolate the force information among a plurality of contiguous force pixels.

As illustrated in the embodiment of FIGS. 6A and 6B, the compressible layer may form an array of individual compressible structures 629. While the array of compressible structures is shown to be disposed on the supporting substrate 612, in other embodiments, the compressible structures may be disposed on a separate substrate which is then physically coupled to either the supporting substrate 612 or sensor substrate 604. Also, in various embodiments, the compressible layer may comprise a grid of compressible structures (as shown in FIG. 3A), or other suitable shapes. The compressible layer is configured to facilitate the local deflection of the pliable component 601 toward the third layer of sensor electrodes 614 in response to force applied to the input surface 602. A measurement of the "force pixel" is used to determine the amount (magnitude) of localized force imparted on the input surface in at least one location.

Figure 7A:
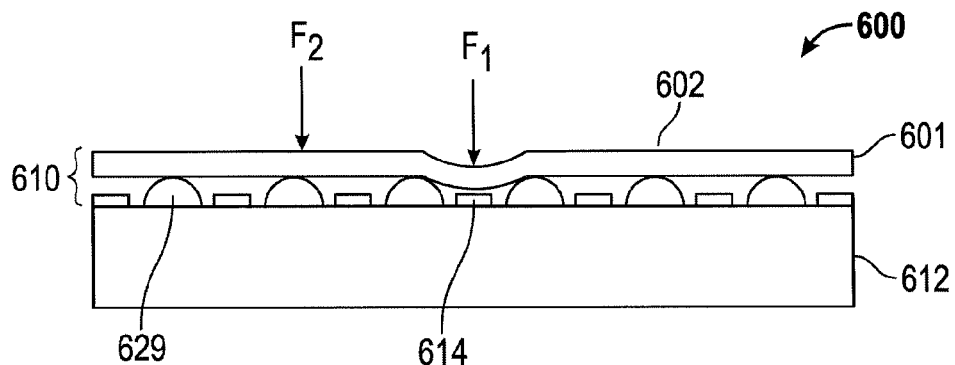
FIGS. 7A-7C are respective cross section views of an exemplary input device stack-up including a pliable component, a compressible layer, and a support layer.
Figure 7B:
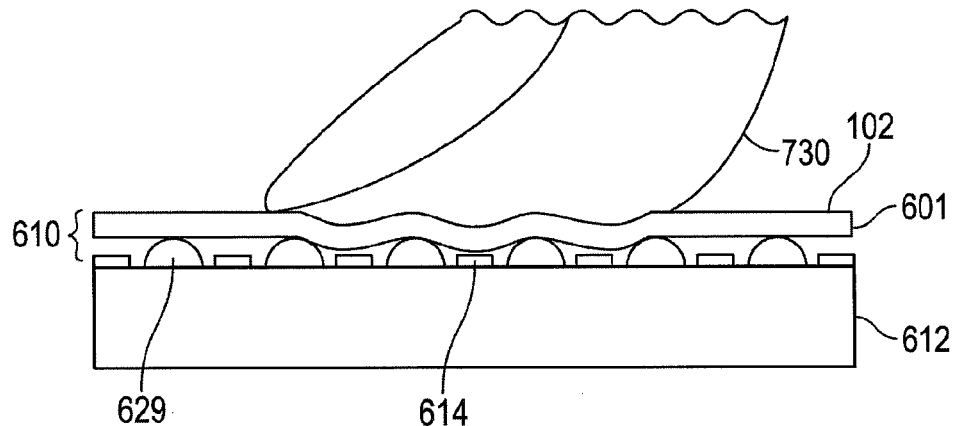
Figure 7C:
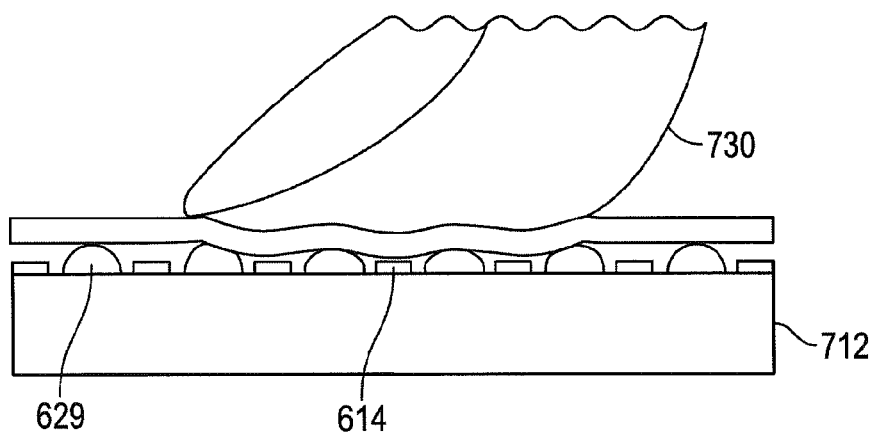

Turning now to FIGS. 7A-C, a simplified side view of input device 600 of FIG. 6 is shown. The pliable component 601 includes respective first and second arrays of capacitive sensor electrodes (not shown for clarity) configured to detect input objects in a sensing region of the input device 600. Still shown in FIGS. 7A-C are the compressible structures 629 and the third array of sensor electrodes 614. As discussed above, force applied to the input surface 602 causes pliable component 601 to bend, and compressible layer 610 to compress, in the vicinity of the applied force. The bending and compression are a function of and/or based on the ratio of the bending stiffness of pliable component 601 to the compression stiffness of compressible layer 610, as well as the physical arrangement of any compressible structures layer 629 which may be present in the compressible layer 610.

For example, as best seen in FIG. 7A, point forces F1 and F2 are applied to the input surface 602 causing a deflection of the pliable component 601 towards the third array of sensor electrodes 614. The point force F1 is illustrated as being applied between compressible structures 629; point force F2 is shown being applied directly above one of the compressible structures 629. FIGS. 7B and 7C also include an exemplary input object 730 (e.g., a finger tip), shown pressing down on the top surface of the input device.

The resulting deflection of the pliable component 601 in response to a force applied to the input surface can be described as the compression of the compressible structures 629 and the compression of the space between the compressible structures 629. For example, the local deflection of the pliable component into the space between the compressible structures 629 is proportional to the local pressure applied to the input surface 602 (for example, F1 in FIG. 7A) and the three dimensional arrangement of structures 629. Furthermore, the local deflection is inversely proportional to the bending stiffness of the pliable component 601. For example, in one embodiment, the pliable component 601 has a thickness of 300µm, a Young Modulus of 4 GPa and a Poisson ratio of 0.38. The compressible layer 610 comprises a plurality of compressible structures 629 disposed in a uniform square array of 5 mm pitch, wherein each of the compressible structures exhibits a Young's Modulus of 500 MPa (e.g., a urethane material).

In response to an applied pressure to the input surface from an input object in the range from 0 to 50 MPa, the pliable component will deflect approximately in the range of 0 to tens of microns between the compressible structures and will compress the compressible structures in the range of 0 to hundreds of nanometers. A measurement of the variable capacitance between the third array of sensor electrodes 614 and at least one sensor electrode disposed in the pliable component 610 (not shown) is used to determine an amount of deflection. The deflection of the pliable component, as measured by the change in the variable capacitance, is indicative of the local force applied by the input object to the input surface 602. A plurality of such local force measurements may be used to determine a total force applied by the input object onto the input surface. As seen in FIG. 7B, an input object 730 (i.e., finger) applies a force to the input surface 602, causing a plurality of local deflections of the pliable component 601 which may be measured using the sensor electrodes 614.

In various embodiments, the pliable component comprises thicknesses on the order of tens of microns to hundreds of microns and a Young's Modulus on the order of 0.1 MPa to 70 Gpa. The pliable component may comprise a combination of various layers of materials such as glass, plastics, metals, polymers and adhesives. The compressible layer comprises thicknesses on the order several microns to hundreds of microns and a Young's modulus on the order of 0.1 MPa to 1 Gpa. The compressible layer may comprise a combination of materials which may be substantially uniform (e.g. a foam, gel, liquid or solid) or substantially non-uniform, such as the arrays of compressible structures discussed above which may include a liquid or gas disposed between them.

Figure 8:
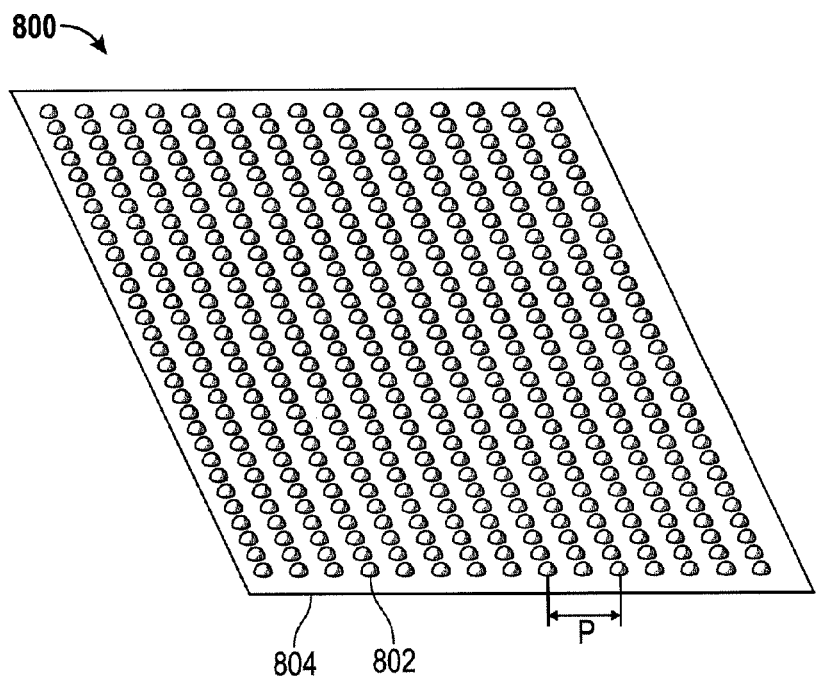
FIG. 8 is a perspective view of a compressible layer in accordance with an embodiment of the invention.

FIG. 8 is a perspective view of an exemplary compressible layer 800 generally corresponding to compressible layers 310 of FIGS. 3A-C and/or compressible layer 610 of FIG. 6. In the illustrated embodiment, compressible layer 800 includes a regular array or matrix compressible structures 802 formed on an upper surface of a substrate 804 and having a pitch or period P. In other embodiments, compressible layer 800 may comprise a uniform volume of any suitable compressible material or an irregular or random series of forms or structures which, on average, yield a substantially uniformly compressible medium for spreading applied force over a localized region surrounding the location of applied force.

Figure 9:
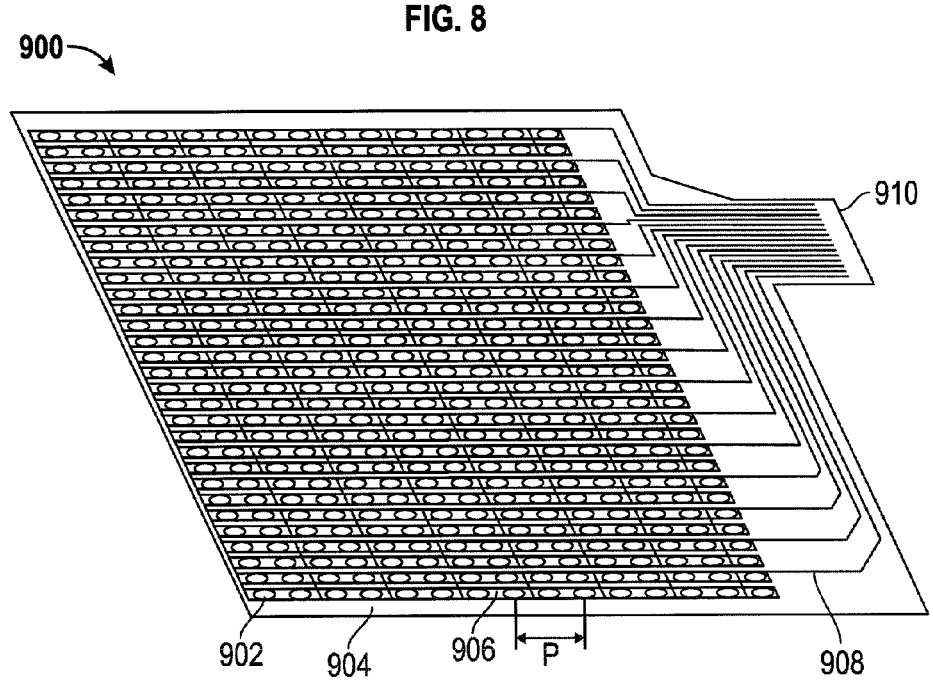
FIG. 9 is a perspective view of an electrode layer in accordance with an embodiment of the invention.

FIG. 9 is a perspective view of an electrode layer 900 generally corresponding to force sensor electrode layer 312 of FIG. 3A-D. In the illustrated embodiment, electrode layer 900 includes a regular array of sensor electrodes 906 formed on an electrode substrate 904 and apertures 902 having a pitch or period P. In an embodiment, sensor electrodes 906 terminate along one side of the array at respective connectors 908 which join together at a tail 910 for connection to the processing system. In other embodiments, the electrodes may comprise any desired shape, arrangement, or configuration.

Figure 10:
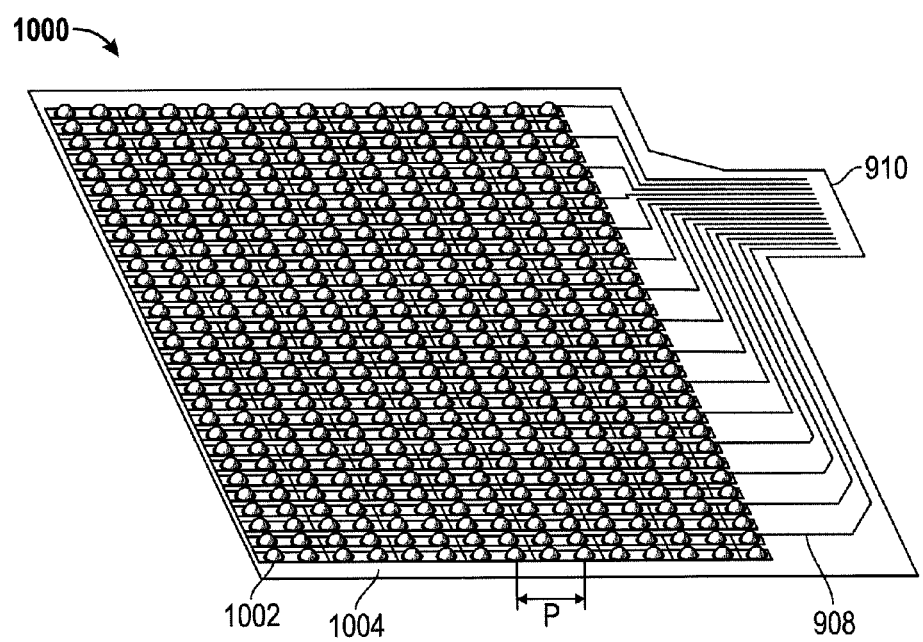
FIG. 10 is a perspective view of the compressible layer of FIG. 6 joined with the electrode layer of FIG. 7 in accordance with an embodiment of the invention.

FIG. 10 is a perspective view of an assembly or stack 1000 including the compressible layer 800 of FIG. 8 joined with the electrode layer 900 of FIG. 9. The apertures 902 of electrode layer 900 may be configured to align with the compressible structures 802 of substrate layer 800 at each coordinate position 1002 (also having a period P) such that the structures 802 extend upwardly through the apertures 902; that is, electrode layer substrate 904 is interposed between the upper surface of substrate 804 and the compressible layer formed by the structures 802. In the illustrated embodiment, the electrode substrate layer 904 and the compressible layer substrate layer 804 are overlaid to form a laminate structure 1004. In other embodiments, the electrodes and compressible layer structures or material may be formed on the same sides or opposite sides of a single substrate layer.

Figure 11:
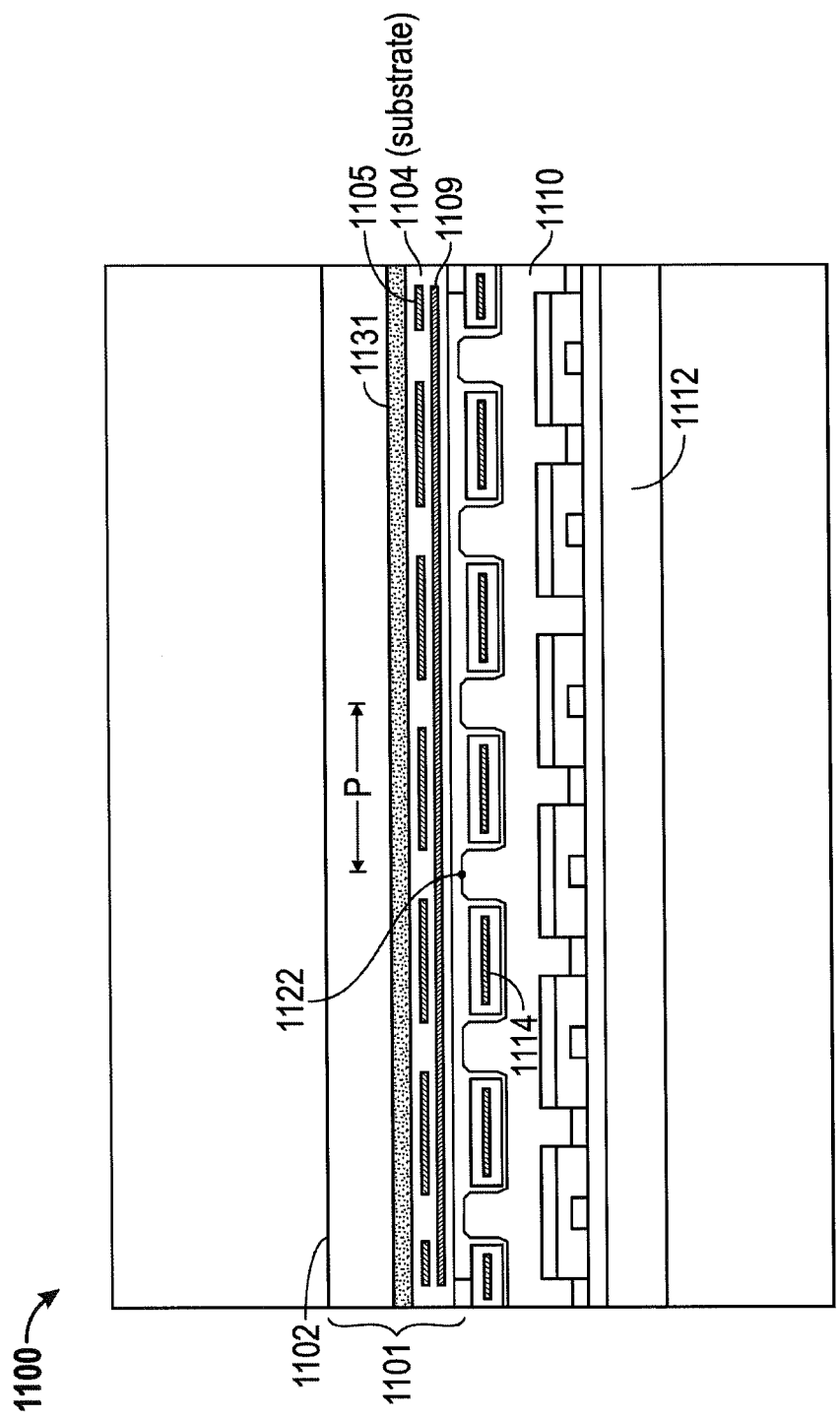
FIG. 11 is a cross section view of an exemplary input device an accordance with a further embodiment of the invention.

FIG. 11 is a cross-section view of an exemplary input device in accordance with the present invention. The input device 1100 includes a pliable component 1101, a compressible spacing layer 1110, and a support layer 1112. The pliable component 1101 comprises an input surface 1102 configured to be touched by input objects and plurality of sensor electrodes configured to detect the input objects. In one embodiment, the pliable component includes at least one layer of capacitive sensor electrodes disposed on a sensor substrate 1104. The capacitive sensor electrodes may comprise at least one transmitter sensor electrode 1109 configured to transmit a sensing signal and at least one receiver sensor electrode 1105 configured to receive a resulting signal, the resulting signal comprising effects of any input objects present in the sensing region of the input device.

In the embodiment shown in FIG. 11, the pliable component 1101 includes a layer of adhesive 1131 configured to physically couple the input surface 1102 and the capacitive sensor substrate 1104. It should be noted that in some embodiments, the capacitive sensor electrodes (such as sensor electrodes 1105 and 1109) may be disposed directly onto the bottom side of the input surface 1102. In some embodiments, the pliable component 1101 may comprise multiple sensor substrates (similar to that of sensor substrate 1104).

With continued reference to FIG. 11, the pliable component is disposed on top of the compressible spacing layer 1110. The compressible spacing layer 1110 is configured to provide a spacing between the capacitive sensor electrodes disposed in the pliable component 1101 and an additional array of capacitive sensor electrodes 1114. The compressible spacing layer 1110 is similar to stack 1000, wherein the compressible spacing layer 1110 comprises a plurality of raised structures 1122 formed on the top surface (facing the pliable component). In the illustrated embodiment, the plurality of raised structures 1122 are have a pitch or period P. The capacitive sensor electrode 1114 are interposed between the plurality of raised structures 1122. The array of capacitive sensor electrodes 1114 may be disposed in a layer similar to layer 900 of FIG. 9.

The layer of capacitive sensor electrodes may comprise a substrate having apertures (or other self-aligning features) configured to match the period of the raised structures 1122. The capacitive sensor electrodes 1114 are configured to couple to at least one sensor electrode of the sensor electrodes 1105 and 1109. Specifically, the capacitive sensor electrodes 1114 may be configured to receive a resulting signal comprising a signal previously transmitted by electrode 1109. This resulting signal is a function of the displacement of the pliable component 1101 (comprising sensor electrodes 1105 and 1109) toward the sensor electrodes 1114. A measurement of the resulting signals of sensor electrodes 1114 may be used to determine force information for input objects applying a force to the input surface 1102.

Figure 12:
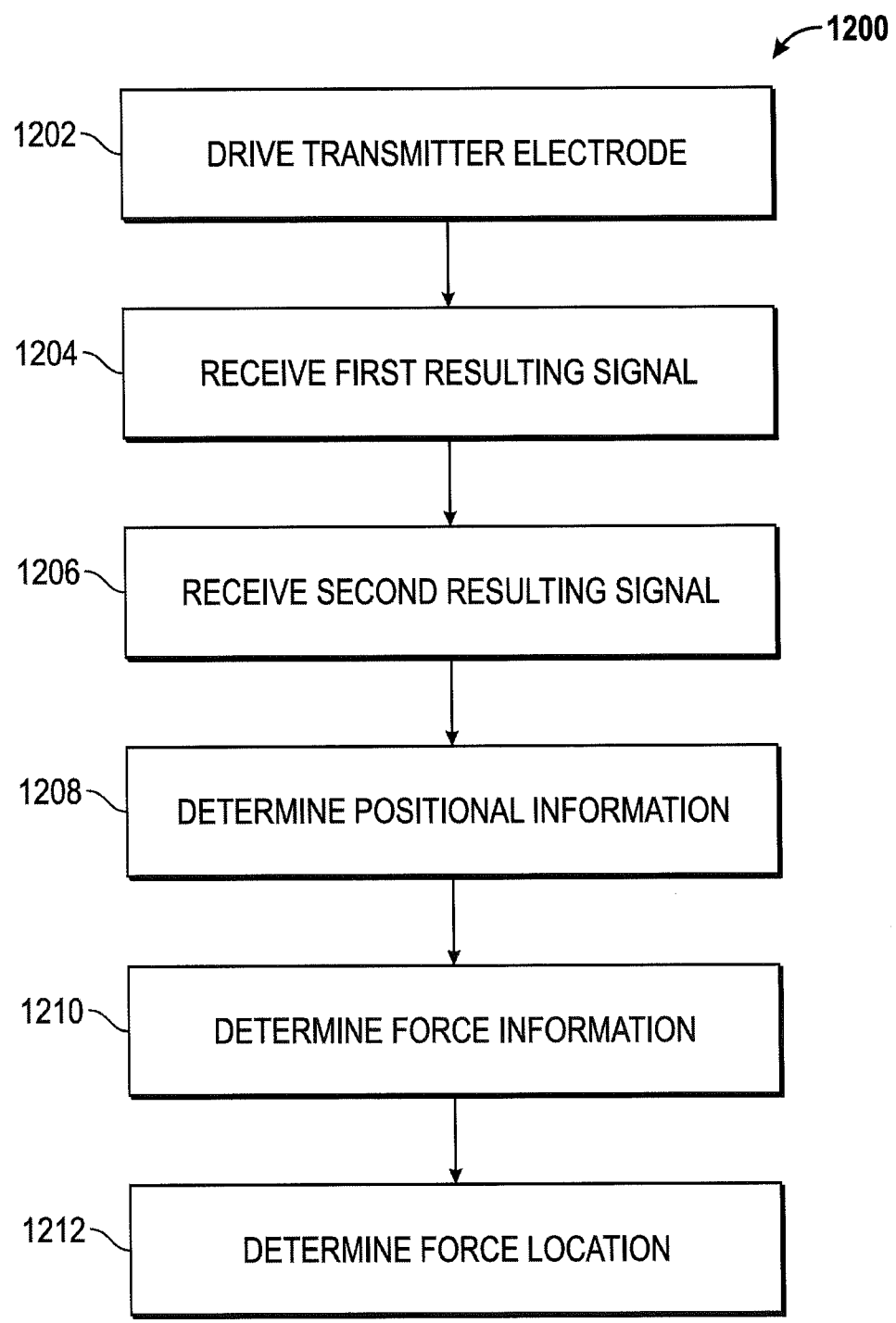
FIG. 12 is a flow chart of a method of operating an electronic system to drive and receive signals onto electrodes to determine force and touch information for an input object in a sensing region in accordance with an embodiment of the invention.

FIG. 12 is a flow chart of a method 1200 of operating electronic systems of the type associated with the devices shown in FIGS. 1-11 in accordance with various embodiments. Method 1200 includes driving a transmitter signal (Task 1202) onto one or more transmitter sensing electrodes, and operating (Task 1204) first and second arrays of sensor electrodes to receive a first resulting signal.

Method 1200 further involves operating (Task 1206) second and third arrays of sensor electrodes to receive a second resulting signal, and determining positional information (Task 1208) and force information (Task 1210) for an input object in the sensing region.

Finally, method 1200 contemplates interpolating or otherwise processing (Task 1212) the force information to accurately determine the location of the applied force based on, inter alia, the ratio of the bending stiffness of the pliable component and the compressive stiffness of the compressible layer.

A capacitive input device is thus provided which is configured to sense input objects in a sensing region. The capacitive input device includes a pliable component having an input surface, a first array of sensor electrodes, and a second array of sensor electrodes, the pliable component characterized by a bending stiffness. The capacitive input device further includes a third array of sensor electrodes and a spacing layer disposed between the third array of sensor electrodes and the pliable component, the spacing layer characterized by a compressive stiffness. The pliable component is configured to deform in response to a force applied to the input surface and to deflect the second array of sensor electrodes towards the third array of sensor electrodes, wherein the deformation of the input surface and the deflection of the second array of sensor electrodes is a function of and/or based on the bending stiffness of the pliable component and the compressive stiffness of the spacing layer, such as a ratio of the bending stiffness of the pliable component to the compressive stiffness of the spacing layer.

In an embodiment the force applied to the input surface deflects a subset of the second array of sensor electrodes towards the third array.

In another embodiment, the pliable component is configured to deform in response to a force applied to the input surface such that at least one sensor electrode of the second array of sensor electrodes deflects towards the third array of sensor electrodes and at least one sensor electrode of the second array of sensor electrodes remains substantially stationary relative to the first array of sensor electrodes.

In an embodiment, the spacing layer comprises at least one of: a closed cell porous material; an open cell porous material; an adhesive; pyramid-shaped structures, dome shaped structures, cone shaped structure, and cylinder or hourglass shaped structures of uniform or different sizes and rigidity; a grid structure; a rigid material; and a compressible material. Moreover, the first, second, and third arrays may comprise a plurality of electrodes, wherein the electrodes of the first arrays are substantially perpendicular to the electrodes of the third array. In addition, the spacing layer may comprise an array of compressible structures having a substantially uniform spring constant. The array of compressible structures in the spacing layer may be formed on a substrate, with the third array of sensor electrodes disposed between the substrate and the spacing layer.

The input device may also include a processing system communicatively coupled to the first, second, and third arrays of sensor electrodes. The processing system may be configured to measure a first capacitive coupling between at least two of: the first array of sensor electrodes; the second array of sensor electrodes; and an input object in the sensing region. The processing system may also be configured to measure a second capacitive coupling between the third array of sensor electrodes and the second array of sensor electrodes; determine positional information for the input object in the sensing region based on a change in at least one of the first and second capacitive coupling; and determine force information for an input object interacting with the input surface based on a change in the second capacitive coupling.

In an embodiment the processing system is further configured to distinguish conductive input objects from non-conductive input objects based on the first and second capacitive coupling.

An electronic system is provided which includes: a pliable component characterized by a bending stiffness, the pliable component comprising an input surface, a first array of sensor electrodes, and a second array of sensor electrodes; a third array of sensor electrodes; a spacing layer characterized by a compressive stiffness and disposed between the pliable component and the third array of sensor electrodes, wherein the pliable component is configured to deflect towards the third array in response to applied force to the input surface, wherein the deflection is a function of the bending stiffness of the pliable component and the compressive stiffness of the spacing layer; and a processing system communicatively coupled to the first, second, and third arrays. The processing system may be configured to: drive a transmitter signal onto a sensor electrode of the second array; receive a first resulting signal from a sensor electrode of the first array, wherein the first resulting signal comprises effects of the capacitive coupling between the sensor electrode of the second array and the sensor electrode of the first array; receive a second resulting signal from a sensor electrode of the third array, wherein the second resulting signal comprises effects of capacitive coupling between the sensor electrode of the third array and the sensor electrode of the second array; and determine positional and force information for an input object interacting with the input surface based on the first and second resulting signals.

A processing system for a capacitive input device is provided which includes a pliable component, the pliable component comprising an input surface and a first and second array of sensor electrodes, the pliable component disposed above a spacing layer, and the spacing layer disposed above a third array of sensor electrodes. The processing system may be communicatively coupled to the first, second, and third array of sensor electrodes and configured to: operate the first and second array of sensor electrodes to form a variable capacitance between the first and second array of sensor electrodes; operate the second and third array of sensor electrodes to form a variable capacitance between the second and third array of sensor electrodes; determine positional information for input objects in contact with the input surface based on a change in the variable capacitance between the first and second array of sensor electrodes; and determine positional and force information for input objects in contact with the input surface based on a change in variable capacitance between the second and third array of sensor electrodes.

In an embodiment, the processing system is further configured to determine positional information for input objects in the sensing region and not in contact with the input surface based on an absolute capacitance of at least one of the first and second array of sensor electrodes. The processing system may also be configured to form a variable capacitance between the first and second array of sensor electrodes by driving a first transmitter signal onto at least one sensor electrode of the second array, and receiving a first type of resulting signal from at least one sensor electrode of the first array, the first type of resulting signal corresponding to the first transmitter signal and effects due to the input object in contact with the input surface; and wherein the processing is configured to form a variable capacitance between the second and third array of sensor electrodes by receiving a second type of resulting signal from at least one sensor electrode of the third array, the second resulting signal corresponding to the first transmitter signal and effect from a deflection of the input surface due to the input object in contact with the input surface.

Moreover, the first and second array of sensor electrodes may be configured to electrically shield the third array of sensor electrodes from input objects in the sensing region; and the second array of sensor electrodes may be configured to shield the first and third array of sensor electrodes from each other.

In an embodiment, the first type of resulting signal received by at least one sensor electrode from the first array of sensor electrodes and the second type of resulting signal received by at least one sensor electrode of the third array of sensor electrodes are received before a second transmitter signal is driven onto the at least one sensor electrode of the second array.

The processing system may be further configured to determine a capacitive interaction image based on the first and second types of resulting signals, the capacitive interaction image comprising the effects of input objects in the sensing regions and deflection of the input surface due to an input object.

The processing system may be further configured to determine a type of input object in the sensing region of the capacitive input device based on the determined positional and force information.

The embodiments and examples set forth herein are presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Other embodiments, uses, and advantages of the invention will be apparent to those skilled in art from the specification and the practice of the disclosed invention.

What is claimed is:

1. An electronic system comprising a capacitive touch screen input device, the capacitive touch screen input device comprising:
    a pliable component comprising an input surface configured to be touched by a user, a first array of sensor electrodes, and a second array of sensor electrodes, the pliable component characterized by a bending stiffness;
    a third array of sensor electrodes;
    a spacing layer disposed between the third array of sensor electrodes and the pliable component, the spacing layer characterized by a compressive stiffness; and
    a display;
    wherein in response to a force applied to the input surface by the user, the input surface is configured to deform and the pliable component is configured to deflect at least one of the second array of sensor electrodes towards the third array of sensor electrodes; and
    wherein the deformation of the input surface and the deflection of the second array of sensor electrodes is based on the bending stiffness of the pliable component and the compressive stiffness of the spacing layer.

2. The electronic system of claim 1, wherein the compressive stiffness of the spacing layer is substantially uniform.

3. The electronic system of claim 1, wherein the spacing layer consists of a substantially uniform volume of material.

4. The electronic system of claim 1, wherein the spacing layer comprises an array of compressible structures, the array of structures comprising a structure selected from a group consisting of: pyramid-shaped structures, dome shaped structures, cone shaped structures, cylinder shaped structures and hourglass shaped structures.

5. The electronic system of claim 1, wherein the input surface comprises glass and plastic.

6. The electronic system of claim 1, wherein the pliable component comprises a first and second sensor substrate and the first array of sensor electrodes is disposed on the first sensor substrate and the second array of sensor electrodes is disposed on the second sensor substrate.

7. The electronic system of claim 1, where in the pliable component comprises a sensor substrate and the first array of sensor electrodes is disposed on a first side of the sensor substrate and the second array of sensor electrodes is disposed on a second side of the sensor substrate, the second side of the sensor substrate being opposite the first side of the sensor substrate.

8. The electronic system of claim 1, wherein the pliable component comprises a sensor substrate and the first array of sensor electrodes and the second array of sensor electrodes are disposed on a single side of the sensor substrate.

9. The electronic system of claim 1, further comprising a processing system communicatively coupled to the first, second, and third arrays of sensor electrodes, the processing system configured to:
    measure a first capacitive coupling between at least two of: the first array of sensor electrodes; the second array of sensor electrodes; and an input object in the sensing region;
    measure a second capacitive coupling between the third array of sensor electrodes and the second array of sensor electrodes;
    determine positional information and force information for the input object in the sensing region from at least one of the first and second capacitive couplings; and
    control a user interface action of the electronic system based on at least one of the determined positional information, the determined force information, a number of input objects in a sensing region of the input device, and a number of input objects contacting the input surface of the input device.

10. The electronic system of claim 9, wherein the user interface action is from a group consisting of: cursor movement, selection, menu navigation, pointing, tapping, clicking, double clicking, panning, zooming, and scrolling.

11. The electronic system of claim 9, wherein the user interface action is modified by at least one of an initiation and rate of speed based on the determine force information.

12. The electronic system of claim 1, wherein the display of the capacitive touch screen is flexible.

13. A processing system for a capacitive input device, the capacitive input device comprising a pliable component having an input surface configured to be touched by a user and a first and second array of sensor electrodes, the pliable component disposed above a spacing layer, and the spacing layer disposed above a third array of sensor electrodes; the processing system communicatively coupled to the first, second, and third arrays of sensor electrodes and configured to:

operate the first, second and third array of sensor electrodes to determine a first type of resulting signal and a second type of resulting signal and determine positional information and force information based on the first and second types of resulting signals, wherein:
the first type of resulting signal corresponds to effects of the input object in contact with an input surface, and
the second type of resulting signal corresponding to effects due to deflection of the input surface due to the input object in contact with the input surface.

14. The processing system of claim 13, wherein the processing system is configured to determine the first resulting signal by operating at least two of the first, second and third arrays of sensor electrodes in at least one of an absolute capacitance and a mutual capacitance sensing mode.

15. The processing system of claim 13, wherein the processing system is configured to determine the second resulting signal by operating at least two arrays of sensor electrodes in mutual capacitance mode, the two arrays selected from the group consisting of the first, second and third array of sensor electrodes.

16. The processing system of claim 13, wherein the processing system is configured to measure a variable capacitance between the first and second array of sensor electrodes by:
driving a first transmitter signal onto at least one sensor electrode of the second array, and
receiving the first type of resulting signal from at least one sensor electrode of the first array, the first resulting signal corresponding to the first transmitter signal and effects of input object in a sensing region of the input device; and
wherein the processing is configured to form a variable capacitance between the second and third array of the sensor electrodes by:
receiving the second type of resulting signal measure at least one sensor electrode of the third arrays, the second resulting signal corresponding to the first transmitter signal and effects from a deflection of the input surface due to the input object applying a force to the input surface.

17. The processing system of claim 13, wherein at least one of the first and second array of sensor electrodes is configured to electrically shield the third arrays of sensor electrodes from input objects in the sensing region; and
the second array of sensor electrodes is configured to shield the first and third arrays of sensor electrodes from each other.

18. The processing system of claim 13, wherein:
the first type of resulting signal received by at least one sensor electrode from the first array of sensor electrodes and the second type of resulting signal received by at least one sensor electrode of the third array of sensor electrodes are received before a second transmitter signal is driven onto the at least one sensor electrode of the second array.

19. The processing system of claim 13, wherein the processing system is further configured to determine a capacitive interaction image based on the first and second types of resulting signals, the capacitive interaction image comprising the effects of input objects in the sensing region and the deflection of the input surface.

20. The processing system of claim 13, further configured to determine a type of input object in the sensing region of the capacitive input device based on the first and second types of resulting signals.

21. The processing system of claim 13, further configured to update a display of the capacitive input device, wherein the pliable component comprises the display and at least one of the arrays of sensor electrodes are used to update the display.

* * * * *